Dec. 14, 1965 R. SOLOMON 3,223,903

POINT CONTACT SEMICONDUCTOR DEVICE WITH A LEAD HAVING LOW EFFECTIVE RATIO OF LENGTH TO DIAMETER

Filed Feb. 24, 1961

Raymond Solomon,
INVENTOR.
BY.
Charles S. Haughey
ATTORNEY.

United States Patent Office 3,223,903

Patented Dec. 14, 1965

3,223,903
POINT CONTACT SEMICONDUCTOR DEVICE WITH A LEAD HAVING LOW EFFECTIVE RATIO OF LENGTH TO DIAMETER

Raymond Solomon, Costa Mesa, Calif., assignor to Hughes Aircraft Company, Culver City, Calif., a corporation of Delaware Filed Feb. 24, 1961, Ser. No. 91,438
3 Claims. (Cl. 317—235)

This invention relates to a point contact semiconductor device and more particularly to a low inductance diode or transistor for high frequency response, especially suited for microwave usage, and to a method of making and packaging the device.

In point, or small junction, devices for high frequency response, several techniques are available for reducing junction capacitance, parasitic capacitance, storage time and other factors affecting high frequency response of the device. Mesas may be etched on a semiconductor crystal and a point junction produced on the mesa, physical size may be reduced, and heavy leads may be welded to the point electrode. As these techniques are used, the length, and the length to diameter ratio, of the point contact lead becomes a limiting factor in high frequency response due to parasitic inductance of the lead in the device package.

As the effective length to diameter ratio of the device lead or leads is reduced, undesired phase shifts are avoided or reduced, parasitic reactance reduction increases the frequency cutoff and improves frequency response of the device, and allows full advantage to be taken of the device characteristics per se of pulse bonded point contact devices, avoiding the limitations and handicaps ordinarily associated with encapsulation or packaging.

The self inductance of a length of wire $l$ and diameter $d$ is given by $$(1) \qquad L=2l\left[\ln\frac{4l}{d}-1+\mu\delta\right]$$

where $\delta$=.02 at 100 mc., and =.005 at 1 kmc.
$l$ and $d$ are in cm., and L is in m$\mu$h.

The smallest length of spring wire that may be used in very small device package designs is about 20 mils long, because shorter wires have insufficient spring action for fabrication. For a 20 mil long, 1 mil diameter wire, according to Equation 1 above, the inductance L is 0.34 m$\mu$h.

The reactive resonance frequency of a package diode is given by $$(2) \qquad f=\frac{1}{2\pi\sqrt{LC}}$$

where L is the inductance associated with the package, and C includes the junction capacitance and any stray capacitance. Assuming an average value of junction capacitance for a point contact diode to be about 0.5 $\mu\mu$f., and substituting in Equation 2 the above calculated value for L, $$f=\frac{1}{2\pi\sqrt{.34\times10^{-9}(.5\times10^{-12})}}$$

$$f=12\text{ kmc.}$$

The above calculation does not include stray capacitance or other inductances associated with a package, so that the reactive resonance frequency may be somewhat lower than the above calculated 12 kmc. This analysis applies to all point contact diodes including tunnel diodes, mixer diodes, and so on. If the effective length of the lead wire $l$ could be reduced to about 3 mils or less, the reactive resonance frequency could be raised to about 50 kmc. by the above type of calculation.

An object and advantage of this invention is the production of very high frequency response point contact diodes and other semiconductor devices, in a package which provides a short effective length point contact electrode in a highly reliable package structure.

The above and other objects and advantages of this invention will be apparent from the balance of this specification, and in the accompanying drawings and claims forming a part thereof, disclosing a preferred embodiment of the invention.

In the manufacture of point contact diodes, which is herein taken to include small junction, and pulse-bonded, semiconductor diodes, a package suitable for stripline assembly is highly desirable for high frequency applications, and requires short effective electrode leads, package size uniformity, and physical as well as electrical stability and reliability. These and other objectives are met, by way of example, by assembling a gallium arsenide semiconductor element into a cylindrical package having end electrode surfaces parallel and bonded to an annular insulating ring which forms a hermetically sealed device package.

Figure 1:
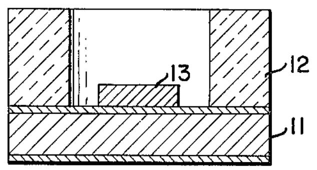
FIGS. 1–4 illustrate successive steps in the manufacture of a point contact semiconductor diode according to this invention, FIG. 4 showing a sectional view of a completed diode.

FIG. 1 shows a Kovar base electrode disc 11 which is preferably plated on both major surfaces with P-type doped gold, such as gold containing 1% zinc or antimony, together with a ring 12 of alumina ceramic insulating material which is metallized on opposite ends with molybdenum-maganese alloy and then gold plated, and a die 13 of gallium-arsenide semiconductor crystal which has been (or is to be) etched to a dome or mesa shaped upper surface. Alternatively other semiconductor crystal materials such as silicon, germanium and the like may be used with suitably selected impurity, or dopant, materials.

The assembly of FIG. 1 is bonded in a suitable furnace at about 650° C., and the semiconductor die may then be etched to the dome or mesa shape. Electro-etching in 5% NaOH at room temperature at 200 milliamps for 3 to 4 minutes will reduce a cylindrical or rectangular GaAs die to a suitable dome shape.

Figure 2:
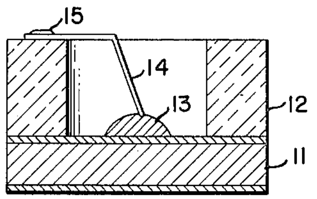

As shown in FIG. 2, a 1.5 mil diameter, 20 mils long Phosphor bronze wire 14, tin coated for N-type doping, is next soldered to the ring 12 with a tin solder 15 about 250° C., the wire 14 being bent to contact the die 13.

The electrode wire 14 is next pulse-bonded to the semiconductor die 13 by a conventional pulse-bonding technique to form an N-type contact zone on the P-type gallium-arsenide crystal 13.

An insulating epoxy-resin 16 is introduced in controlled amount, as by touching a drop thereof on a wire end to the inner sidewall of the ring 12, from which it will wet the sidewall, the base 11, the die 13 and the lead wire 14, the wire being covered a minimum length thereof above the pulse-formed contact. In assemblies of the size herein illustrated, of packages having final external dimensions of about 0.30″ thickness and about .050″ diameter, the wetability of the epoxy resin 16 forms it into a concave shape, over the dome-shaped die 13, providing a minimum thickness less than 3 mils along the lead wire 14. The epoxy resin may be cured by a suitable curing cycle, such as 48 hours at room temperature for preferred commercial resin.

Alternative to the epoxy resin, other insulating materials may be used, such as polystyrene in a solvent, or the like.

Figure 3:
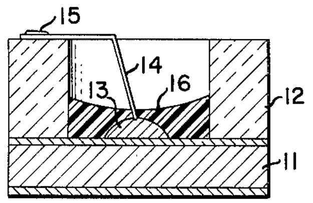

To the assembly of FIG. 3 a silver-epoxy 17 consisting essentially of 80% silver in epoxy is added to the recess on top of the insulating epoxy, and a cap electrode 18 of gold plated tantalum is placed on top and pressed, while the silver-epoxy is wet to the desired assembly thickness. Excess silver-epoxy is allowed to extrude from the ring-cap gap, to be trimmed later, and a hermetic, electrically conducting seal is formed by the silver-epoxy. The tantalum cap and Kovar base structure is chosen to provide magnetic polarity to the assembly, and the external gold coating is primarily for protection of the electrode surfaces and better adherence of the epoxy resins.

Figure 4:
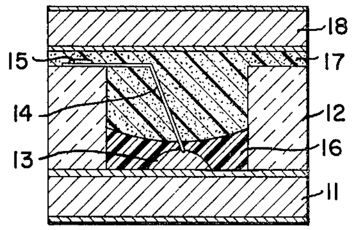

The completed diode assembly of FIG. 4 provides an insulating barrier, epoxy 16, which has a minimum thickness along the lead wire 14 and thus produces a minimum capacitance between the die 11 and the silver-epoxy 17. Since the silver-epoxy is highly electrically conducting, the effective length of the small diameter lead wire 14 between the die 11 and the external electrode cap 18 is reduced, its length to diameter ratio decreased, and the packaged device frequency response is greatly enhanced due to reduction of the inductance of the wire 14.

Figure 5:
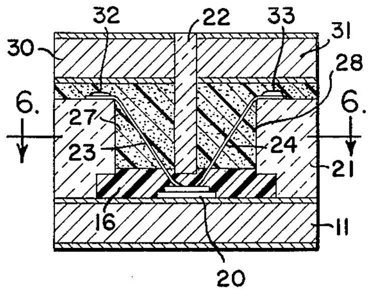
FIGS. 5 and 6 show transistor manufactured according to this invention.
Figure 6:
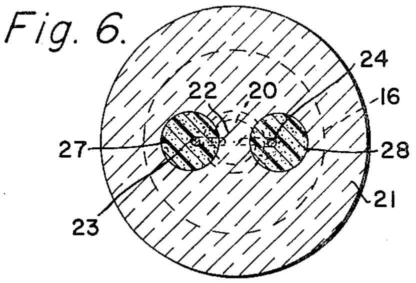

A transistor structure may be produced as illustrated in FIGS. 5 and 6, in which an alternate alumina ring or body structure 21 comprises a bridge 22 across the hole therein and extending a few mils short of the simeconductor die 20 in the assembly. In this structure it may be preferred to pulse bond a pair of lead wires 23 and 24 to the semiconductor die 20 before assembly of the ring or body 21 onto the base 11, or the bridge 22 may be used as a guide when pulse bonding the leads 23 and 24 to the die 20. Solder 32, 33 bonds the leads 23, 24 to the body 21.

After assembly of the ceramic body 21 and the die 20 to the base 11, an insulating material such as epoxy 16 is added sufficient to cover the die 20 and the lower portion of the bridge 22 to electrically insulate leads 23 and 24 from each other, and silver epoxy 27 and 28 is then added to each of the lead holes for the leads 23 and 24. Separate caps 30 and 31 of gold plated tantalum are added to cover the silver epoxy and form respective transistor device electrodes, ordinarily emitter and base electrodes, which reduce the lead inductance in the manner heretofore explained in connection with the diode of FIG. 4.

In galluim-arsenide diode devices made according to the method herein disclosed, the cut-off frequency was increased by a factor of six, with an effective lead wire length between the die 11 and the silver-epoxy 17 of about 3 mils as compared with an effective length of 20 mils when assembled with all epoxy resin of the insulating type. By controlled variation of the amount of insulating epoxy 16 used, the effective length of the lead wire 14 may be adjusted and predetermined, high frequency packaged device characteristics may be produced. Thus for a tunnel diode and tuned amplifier, a family of packaged device characteristics may be controllably produced by variation only of the proportion of insulating epoxy used in the assembly. The usefulness of tunnel diode devices produced according to this invention from gallium-arsenide may be extended to the 50 kmc. range, and other devices may be extended to higher ranges. Mixer diodes, parametric diodes or varactors, and tunnel diodes may be produced according to this invention.

To produce opposite N and P-type regions opposite to those illustrated, a tin-doped gallium-arsenide crystal may be used, and the wire may be zinc, or tin-zinc coated to produce a P-type region upon pulse-bonding. Other variations will be apparent to those of ordinary skill in the art.

What is claimed is:

1. A semiconductor device which comprises: a semiconductor body having a lead; an electrode bonded to the body; an insulating ring bonded to the electrode providing a wall surrounding the body; electrically insulating material filling a portion of the ring and covering the body and a portion only of the lead; and an electrically conducting material filling the balance of the ring and making electrical connection to said lead, whereby to reduce the effective length to diameter ratio of the lead.

2. A semiconductor device, comprising: a semiconductor body; a pair of leads attached to first and second portions of the body; an electrode attached to a third portion of the body; an electrically insulating body bonded to the electrode, surrounding the semiconductor body and having a pair of holes therein with each of the leads extending into one of the holes; an insulating material surrounding the semiconductor body and a portion of the leads adjacent the semiconductor body and extending into each of the holes; and a conducting material filling the balance of the holes and electrically contacting the respective lead therein.

3. A semiconductor device, comprising: a semiconductor body; a pair of leads attached to first and second portions of the body; a first electrode attached to a third portion of the body; an electrically insulating body bonded to the electrode, surrounding the semiconductor body and having a pair of holes therein with each of the leads extending into one of the holes; an insulating material surrounding the semiconductor body and a portion of the leads adjacent the semiconductor body and extending into each of the holes and a conducting material filling the balance of the holes and electrically contacting the respective lead therein, second and third electrodes each covering a hole and electrically connected to the conducting material therein whereby to reduce the effective length to diameter ratio of each of the leads.

References Cited by the Examiner

UNITED STATES PATENTS

| | | | |
|---|---|---|---|
| 2,569,570 | 10/1951 | Matare et al. | 317—236 |
| 2,606,960 | 8/1952 | Little | 317—235 |
| 2,691,750 | 10/1954 | Shive | 317—235 |
| 2,752,541 | 6/1956 | Losco | 317—235 |
| 2,753,497 | 7/1956 | Jenkins et al. | 317—236 |
| 3,032,695 | 5/1962 | Zielasek | 317—235 X |
| 3,030,557 | 4/1962 | Dermit | 317—234 |

JOHN W. HUCKERT, *Primary Examiner.*

SAMUEL BERNSTEIN, JAMES D. KALLAM, *Examiners.*

A. S. KATZ, *Assistant Examiner.*